United States Patent [19]

Smith et al.

[11] Patent Number: 5,332,918
[45] Date of Patent: Jul. 26, 1994

[54] ULTRA-HIGH-SPEED PHOTOCONDUCTIVE DEVICES USING SEMI-INSULATING LAYERS

[75] Inventors: Frank W. Smith, Cambridge; Mark A. Hollis, Concord; Arthur R. Calawa, Wellesley; Vicky Diadiuk, Lincoln; Han Q. Le, Newton, all of Mass.

[73] Assignee: Massachusetts Institute of Technology, Cambridge, Mass.

[21] Appl. No.: 938,385

[22] Filed: Aug. 31, 1992

Related U.S. Application Data

[60] Division of Ser. No. 312,133, Feb. 17, 1989, Pat. No. 5,168,069, which is a continuation-in-part of Ser. No. 157,806, Feb. 19, 1988, Pat. No. 4,952,527.

[51] Int. Cl.$^5$ .................... H01L 27/14; H01L 31/00; H01L 23/485
[52] U.S. Cl. .................... 257/431; 257/432; 257/439; 257/664; 257/775; 257/459; 257/536; 257/537; 257/184; 338/15
[58] Field of Search ............ 257/431, 432, 536, 537, 257/459, 10, 21, 53, 80, 184, 439, 440, 449, 473, 664; 338/15

[56] References Cited

U.S. PATENT DOCUMENTS

| | | | |
|---|---|---|---|
| 3,530,298 | 9/1970 | Hubbard et al. | 250/199 |
| 3,716,804 | 2/1973 | Groschwitz | 332/7.51 |
| 3,917,943 | 11/1975 | Auston | 250/211 J |
| 3,923,380 | 12/1975 | Kaisha et al. | 350/160 R |
| 3,942,132 | 3/1976 | Zinn | 331/94.5 H |
| 3,949,224 | 4/1976 | Klingen | 250/216 |
| 3,958,862 | 5/1976 | Victor | 350/160 R |
| 3,962,657 | 6/1976 | Redman et al. | 332/7.51 |
| 4,020,341 | 4/1977 | Javan | 250/211 J |
| 4,218,618 | 8/1980 | Mourou | |
| 4,291,323 | 9/1981 | Bachmann | 357/30 |
| 4,293,956 | 10/1981 | Alstatt | 455/327 |
| 4,301,362 | 11/1981 | Mourou | 250/211 J |
| 4,376,285 | 3/1983 | Leonberger et al. | 357/17 |
| 4,396,833 | 8/1983 | Pan | 250/211 R |
| 4,525,871 | 6/1985 | Foyt et al. | 455/325 |
| 4,713,354 | 12/1987 | Egawa et al. | 437/22 |
| 4,807,006 | 2/1989 | Rogers et al. | 357/30 |
| 4,839,510 | 6/1989 | Okabe et al. | 250/211 |
| 4,933,542 | 6/1990 | Bokor et al. | 357/30 |
| 4,978,910 | 12/1990 | Knox et al. | 324/96 |

FOREIGN PATENT DOCUMENTS 0133983 7/1984 European Pat. Off. .
PCT/US89/-
00666 9/1989 European Pat. Off. .

OTHER PUBLICATIONS

Beneking, "On the Response Behavior of Fast Photoconductive Optical Planar and Coaxial Semiconductor Detectors", IEEE Trans. on Electron Devices, vol. ED-29, No. 9, Sep. 1982, pp. 14314.

Campbell, "Enhanced Protection of GaAs Against Thermal Surface Degradation by Encapsulated Annealing in an Arsine Ambient", Appl. Phys. Lett. 45(1), Jul. 1, 1984, pp. 95-97.

Miller et al., "Molecular-Beam-Epitaxy GaAs Regrowth with Clean Interfaces by Arsenic Passivation," J. Appl. Phys. 57(6), Mar. 15, 1985, pp. 1922-1927.

Rossi et al., "Reduced Reverse Bias Current in Al--GaAs and In$_{0.75}$Ga$_{0.25}$As-GaAs Junctions Containing an Interfacial Arsenic Layer", J. Vac. Sci. Technol. B5(4), Jul./Aug. 1987, pp. 982-984.

(List continued on next page.)

Primary Examiner—Sara W. Crane
Assistant Examiner—Alice W. Tang
Attorney, Agent, or Firm—Hamilton, Brook, Smith & Reynolds

[57] ABSTRACT

An ultra-high-speed photoconductive device is described which comprises a homoepitaxial semi-insulating III-V layer, or body, upon which ohmic/conductive contacts, or strips, separated by a small gap, are formed. The semi-insulating body, or layer, is produced by low temperature growth of III-V compounds by MBE. In a GaAs embodiment, the layer is grown under arsenic stable growth conditions, at a substrate temperature preferably in the range of 150° to about 300° C.

13 Claims, 3 Drawing Sheets

OTHER PUBLICATIONS

Stanley et al., "MBE on InP and Other P-Containing Compounds", *The Physics and Technology of Molecular Beam Epitaxy*, Plenum Press, N.Y. 1985, pp. 275-311.

Murotani et al., "Growth Temperature Dependence in Molecular Beam Epitaxy of Gallium Arsenide", J. of Crystal Growth, 45, 1978, pp. 302-308.

Neare et al., "Temperature Range for Growth of Auto epitaxial GaAs Films by MBE", J. of Crystal Growth, 43, 1978, pp. 204-208.

Casey et al., "Insulating Layers By MBE", *The Physics and Technology & Molecular Beam Epitaxy*, Plenum Press, N.Y. 1985, pp. 413-423.

Maezawa et al. "Large Transconductance n+-Ge Gate AlGaAs/GaAs MISFET with Thin Gate Insulator", IEEE Electron Device Letters, vol. EDL-7, No. 7, Jul. 1986, pp. 454-456.

Swaminathan et al. "Effect of Growth Temperature on the Photoluminescent Spectra from Sn-doped $Ga_{1-x}Al_xAs$ Grown by Molecular Beam Epitaxy", Appl. Phys. Letter 38(5), Mar. 1, 1981, pp. 347-349.

Zuleeg et al., "Channel and Substrate Currents in GaAs FETs Due to Ionizing Radiation", IEEE Trans. on Nuclear Science, vol. NS-30, No. 6, Dec. 1983, pp. 4151-4156.

Walton et al., "The Effects of Transient Radiation on GaAs Schottky Diode FET Logic Circuits", IEEEE Trans. on Nuclear Science, vol. NS-30, No. 6, Dec. 1983, pp. 4178-4182.

Xin et al., "Capped Versus Capless Heat Treatment of Molecular Beam Epitaxial GaAs", Appl. Phys. Lett. 41(8), Oct. 15, 1982, pp. 742-744.

Weisbuch et al., "Optical Properties and Interface Disorder of $GaAs-Al_xGa_{1-x}As$ Multi-Quantum Well Structure", Inst. Phys. Conf. Ser. No. 56, 1981, Chapter 9, pp. 711-720.

Naganuma et al. "GaAs, GaP, and $GaAs_{1-x}P_x$ Films Deposited by Molecular Beam Epitaxy", Physica Status Solidi (a) 31, 1975, pp. 187-200.

Metze et al., "An Investigation of GaAs Films Grown by MBE at Low Substrate Temperatures and Growth Rates", J. Vac. Sci. Technol. B1(2), Apr.-Jun. 1983, pp. 166-169.

McFee et al., "Molecular Beam Epitaxial Growth of InP", J. Electrochem. Soc.=Solid-State Sci. & Technol., vol. 124, 1977, pp. 259-272.

Wicks et al., "Photoluminesence of $Al_xGa_{1-x}As$ Grown by Molecular Beam Epitaxy", J. Appl. Phys. 52(9), Sep. 1981, pp. 5792-5796.

Metze et al., "Effects of Very Low Growth Rates on GaAs Grown by Molecular Beam Epitaxy at Low Substrate Temperature", Appl. Phys. Lett. 42(9), May 1, 1983, pp. 818-820.

Donnelly et al., "Monolithic Two-Dimensional Surface-Emitting Arrays of GaAs/AlGaAs Diode Lasers", Appl. Phys. Lett. 51(15), Oct. 12, 1987, pp. 1138-1140.

Bar-Chaim et al., "GaAs Integrated Optoelectronics", IEEE Trans. on Electron Devices, vol. ED-29, No. 9, Sep. 1982, pp. 1372-1381.

Fukuzawa et al., "Monolithic Integration of a GaAlAs Injection Laser with a Schottky-Gate Field Effect Transistor", Appl. Phys. Lett. 36(3), Feb. 1, 1980, pp. 181-183.

Smith et al., "New MBE Buffer For Micron and Quarter-Micron Gate GaAs MESFET's", Proceedings of the IEEE/Cornell Conference on High Speed Semiconductor Devices and Circuits, 1987, p. 229t.

Stall et al., "Deep Levels in Molecular-Beam-Epitaxial GaAs", Electronics Letters, vol. 16, No. 5, Jan. 30, 1980, pp. 171-172.

Smith et al., "New MBE Buffer for Micron and Quarter-Micron Gate GaAs MESFET", IEEE Cornell Conference on High Speed Semiconductor Devices-Abstract, Aug. 11, 1987.

Smith et al., "New MBE Buffer for Micron and Quarter-Micron Gate GaAs MESFETs", IEEE Device Research on High Speed Semiconductor Devices-Abstract, Jun. 24, 1987.

Smith et al., "New MBE Buffer Used to Eliminate Backgating in GaAs MESFETs", MIT Lincoln Laboratory Solid-State Research, Quarterly Technical Report (Distributed Feb. 23, 1987), pp. 1-10.

Chang et al., "Summary Abstract: Protection of an Interrupted Molecular-Beam-Epitaxially Grown Surface by a Thin Epitaxial Layer of InAs" J. Vac. Sci. Technol. 133(2), Mar./Apr. 1985, pp. 518.

Kasahara et al., "Effect of Arsenic Partial Pressure on Capless Anneal of Ion Implanted GaAs", J. of the Electrochem. Society, vol. 126, No. 11, 1979, pp. 1997-2001.

(List continued on next page.)

OTHER PUBLICATIONS

Patte, "Microwave Switching Performance of High-Speed Optoelectronic Switches: An Effiency Comparison of the Basic Types", IEEE Proceedings-I, vol. 128, No. 6, Dec. 1981, pp. 193-196.

Mathur et al., "Carrier Relaxation Mechanisms in $CdS_{0.5}Se_{0.5}$ Optoelectronic Switches", J. Appl. Phys. 51(9), Sep. 1980, pp. 4889-4893.

Y. Horikoshi, et al. "Low-Temperature Growth of GaAs and AlAs-GaAs Quantum-Well Layers by Modified Molecular Beam Epitaxy", J JAP. 25 (1986), Oct., No. 10.

"New MBE Buffer Used to Eliminate Backgating in GaAs MESFET's", Smith et al., *IEEE Electron Device Letters 9*, Feb./1988, No. 2. pp. 77-80.

"Low-Temperature Growth of GaAs and AlAs-GaAs Quantum-Well Layers by Modified Molecular Beam Epitaxy", Horikoshi et al., Japanese Journal of Applied Physics 25 (1986) Oct. No. 10, part 2, pp. L868-L870.

"Gain and Bandwidth of Fast Near-Infrared Photodetectors: A Comparison of Diodes, Phototransistors, and Photoconductive Devices", IEEE Transactions on Electron Devices, vol. Ed-29, No. 9, Sep. 1982, pp. 1420-1431, Beneking.

"High Speed InP Optoelectronic Switch", Leonberger et al., *Appl. Phys. Lett.* 35(9), Nov. 1979, pp. 712-714.

"GaAs Infrared Source for Optoelectronic Applications", 1963, International SOlid-State Ckts Con. pp. 108-109, Baird et al.

"Isolation of Junction Devices in GaAs Using Proton Bombardment", Foyt et al., Solid-State Electronics, 1969, vol. 12, pp. 209-214.

ULTRA-HIGH-SPEED PHOTOCONDUCTIVE DEVICES USING SEMI-INSULATING LAYERS

GOVERNMENT RIGHTS

The United States Government has rights in this invention pursuant to U.S. Air Force Contract No. F19628-85-C-0002.

This application is a division of application Ser. No. 07/312,133, filed on Feb. 17, 1989, U.S. Pat. No. 5,168,069, which is a continuation-in-part of U.S. application Ser. No. 07/157,806 filed Feb. 19, 1988, U.S. Pat. No. 4,952,527.

BACKGROUND ART

The present application relates to photoconductors and, in particular, to photoconductive semiconductors for detecting light, i.e., photodetectors or for switching voltages, i.e. photoconductive switches. Such devices are used in a variety of applications ranging from the study of the physics of superconducting thin films [W. J. Gallagher, et al., *Appl. Phys. Lett.* 50, 350 (1987)] to use in the electro-optic sampling technique [J. A. Valdmanis et al, in "Picosecond Optoelectronic Devices", edited by C. H. Lee (Academic Press, New York, 1984), p. 249], for probing integrated circuits and measuring the microwave scattering parameters of high-speed semiconductor devices. Other potential applications include use as a detector for optical communications, optical interconnects for VLSI circuitry and packaging [G. Turner et al., paper presented at the MRS Spring Meeting, Reno, Nev. (1988)], and as an element for optical signal processing [A. G. Foyt et al., in "Picosecond Optoelectronic Devices", edited by C. H. Lee (Academic Press, New York, 1984, p. 271]. In the switching applications, it is of primary importance that the device be capable of high speed operation, i.e., that the rate of conductivity change is high enough to respond to very fast changes in photoexcitation intensity.

Typically, a photoconductive device consists of a semi-insulating semiconductor body upon which an electrically conductive strip is formed. A small gap is made in the strip. A voltage is applied to one side of the strip. When the gap is illuminated with an intense light pulse that is absorbed near the semiconductor surface, a photogenerated electron-hole plasma is formed creating a conductive path across the gap, allowing current to flow. In this state, the switch is considered to be switched ON. When the light pulse is turned off, the current in the photoconductive detector, or switch, turns off with a decay time characteristic of the recombination lifetime of the semi-insulating semiconductor. When no light is incident, little current flows from one conductor to the other through the semi-insulating material.

In response to fast light pulses, most standard semi-insulating semiconducting films exhibit a long turn-off transient compared to the speed of the light pulse due to long recombination lifetimes of the semiconductor material.

DISCLOSURE OF THE INVENTION

A semi-insulating, highly non-stoichiometric film of homoepitaxy III-V material (GaAs) deposited by molecular beam epitaxy (MBE) on a homogenous III-V surface (GaAs) of a substrate is described in the above-referenced related U.S. patent application. Note III-V material refers to elements in the periodic table found in columns III-V of such table. The film is grown at substrate temperatures substantially lower than those typically used for the growth of high quality GaAs epitaxial layers. After the film is grown to a suitable thickness, the outer surface is reconstructed and stabilized to enable good quality crystal growth of subsequent layers. Reconstruction is achieved by annealing in an ambient containing the more volatile of the III-V species, i.e., for GaAs the ambient is As; for InP the ambient is P.

The function of stabilizing is to prevent or minimize out-diffusion of the more volatile specie from the low temperature layer. This may be achieved by providing a careful choice of initial regrowth temperature, to produce a stabilizing layer over the low temperature layer. Alternatively, a stabilizing layer of material, which is capable of preventing out-diffusion, may be grown over the low temperature layer. This film of low-temperature GaAs (LT GaAs) is highly resistive and crystalline. Yet, high quality conducting GaAs layers can be grown upon it at normal MBE growth temperatures. In the original experiments described in the parent application, it was thought that the LT GaAs was totally optically inert or insensitive to light. Early work on this material focused on its use as a buffer layer for electronic devices and circuits. Dramatic improvements in device and circuit performance have been achieved using this material.

The present invention comprises, in general, a method and apparatus for high speed photoconductive devices. The apparatus comprises a crystalline semi-insulating III-V film upon which conductive pads, or strips, are formed. A small gap is formed in the strip. The film is formed by homoepitaxial growth of III-V materials by MBE at low temperatures, in accordance with the methods described in the aforementioned U.S. patent application (now U.S. Pat. No. 4,952,527) and incorporated herein by reference.

The LT GaAs material is formed by MBE on a SI-GaAs substrate using Ga and $As_4$ beam fluxes, under arsenic stable growth conditions, at optimal substrate temperatures between 150° to 250° C., and at growth rates of 1 micron/hour.

The range of 150°-250° C. is believed to be an optimal growth temperature range to produce LT GaAs layer 14. However, temperatures below 300° C. are contemplated as being suitable for LT GaAs layer growth. These growth temperatures are substantially lower than those used in previous studies of GaAs grown by MBE at low substrate temperatures [Growth-Parameter Dependence of Deep Levels in Molecular-Beam-Epitaxial GaAs", Stall et al, *Electronics Letters*, (1980) 171-172; "Growth Temperature Dependence in Molecular Beam Epitaxy of Gallium Arsenide", Murotani et al., *Journal of Crystal Growth* 45 (1978) 302-308, "Temperature Range for Growth of Autoepitaxial GaAs Films by MBE", Neave et al, *Journal of Crystal Growth* 43 (1978) 204-208, "An Investigation of GaAs Films Grown by MBE at Low Substrate Temperatures and Growth Rates", Metze et al., *J. Vac. Sci. Technol.* B1(2), (1980) 166-169].

The reflected high energy electron diffraction (RHEED) pattern observed during growth, for substrate temperatures as low as 200° C., indicates that the LT GaAs Layer 14 is crystalline. This result has been confirmed by double-crystal x-ray diffraction. The LT GaAs Layer 14 resistivity increases with decreasing growth temperature, but below 200° C. it has not presently been possible to grow crystalline layers of sufficient thickness. All the data presented here are for the LT GaAs layers grown at 200° C. The resistivity of the LT GaAs layers grown is in excess of $10^7$ ohm-cm. The exact resistivity could not be determined using conventional Hall-effect measurement techniques, because the resistivity exceeds the measuring capability of our equipment. The material is non-stoichiometric GaAs having an excess of about 1% As, as determined by Auger Electron Spectroscopy.

After a LT GaAs Layer 14 of about 2 microns is grown as described above, on an SI-GaAs substrate, the structure is brought to a temperature of between about 480° and 580° C. and heat treated in an arsenic ambient at that temperature for about 10 minutes to reconstruct the exposed surface of the LT GaAs Layer 14 to a short depth. Next, a thin (30–200 Å) buffer stabilizing layer 15 of GaAs is deposited by MBE at a relatively low growth temperature of 550° C. or less. The heat treatment appears to alleviate surface crystalline defects and the stabilizing layer enables subsequent growth of good quality crystalline GaAs layers on the buffer stabilizing layer 15. As an alternative to regrowth of the GaAs, other materials capable of preventing out-diffusion, but having appropriate lattice matching feature for growth of active layer thereon, may be used, such as Al, AlGaAs, or a thin GaAs/AlGaAs superlattice. Two experimental devices, made of LT GaAs semi-insulating film in accordance with the invention, have been tested and shown to have response times of 7.5 picoseconds and about 1 picosecond, respectively. The approximately 1 picosecond result is the fastest time reported for a GaAs-based photoconductive device.

This result is virtually the same as the fastest photoconductive detector ever reported. The fastest photoconductive detector reported to date is oxygen-implanted silicon-on-sapphire (SOS). This detector has a measured response time of approximately 1 ps [M. B. Ketchen et al., *Appl. Phys. Lett.* 48, 751 (1986) and F. E. Doany et al., *Appl. Phys. Lett.* 50, 4670 (1987)]. However, the sensitivity of this SOS based device is considerably less than that measured for the present device. Many devices of this type are unstable at room temperature and only have a "shelf-life" of approximately one week. In contrast, the sample of the present invention, which produced the approximately 1 picosecond measurement, was grown about 9 months prior to testing.

BEST MODE OF CARRYING OUT THE INVENTION

Figure 1:
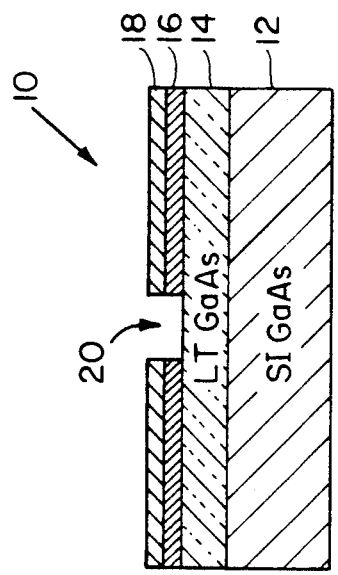
FIG. 1 is a schematic side view of a first embodiment of the optoelectric device of the invention.
Figure 2:
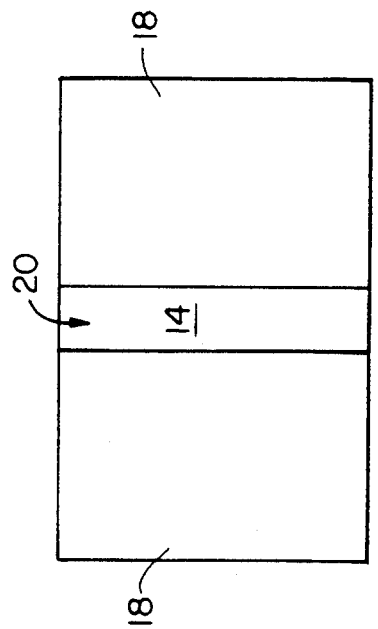
FIG. 2 is a top view of the embodiment of FIG. 1.

Referring now to FIGS. 1 and 2, the invention will be described in detail in connection therewith. It should be understood that while the device of FIGS. 1 and 2 is a GaAs structure, other III–V compounds, such as InP, GaP, or GaAlAs, are contemplated as being within the scope of the invention. FIG. 1 is a schematic cross-section of a GaAs photoconductive device 10 made in accordance with the invention. The device comprises a low temperature GaAs layer 14 about 2 microns thick formed by MBE on a semi-insulating GaAs substrate 12. Note: While the term "layer" is used to define the films formed on substrates, it is intended that this term also covers films disposed in regions of the substrate other than the entire substrate surface.

Layer 14 is formed by MBE on the SI-GaAs substrate 12 using Ga and $As_4$ beam fluxes, under arsenic stable growth conditions, at optimal substrate temperatures between 150° to 250° C., and at growth rates of 1 micron/hour, all as described in the above-referenced co-pending patent application in connection with the growth of low-temperature buffer layers. These films of LT GaAs have both electrical and optical properties that are markedly different from GaAs grown at 580° C. Although the LT GaAs is crystalline, as demonstrated by x-ray diffraction and transmitted electron diffraction measurements, its resistivity is substantially greater than that of semi-insulating GaAs. The resistivity of the LT GaAs is greater than $10^7$ ohm-cm. Further, the LT GaAs exhibits virtually no photoluminescence. The increase in resistivity is consistent with a dramatic increase in the deep level concentration in the film as the substrate temperature is reduced, but deep levels alone would not explain a resistivity substantially greater than that of semi-insulating GaAs. The abnormally high resistivity has so far precluded measurements of carrier mobility. The resistivity increase appears to be associated with excess arsenic incorporated into the LT GaAs. Auger electron spectroscopy indicates that LT GaAs grown at 200° C. is highly non-stoichiometric; the LT GaAs is approximately 50.5% As and 49.5% Ga.

Transmission electron microscopy studies indicate that the dislocation density in LT GaAs is as low as that seen in GaAs epitaxial layers grown at normal substrate temperatures. Short photoexcited carrier lifetime, coupled with high carrier mobility, are the desired characteristics for a high speed photoconductive switch. The crystal perfection can lead to a high mobility, while a high deep level density can lead to short recombination lifetimes. Also, the measured dielectric breakdown field of LT GaAs is in excess of $3 \times 10^5$ V/cm. This result suggests that high-voltage electrical impulses can be generated from LT GaAs photoconductive switches.

Optionally, after a layer 14 of about 2 microns is grown as described above, on an SI-GaAs substrate, the structure is brought to a temperature of between about 480° and 580° C. and heat treated in an arsenic ambient at that temperature for about 10 minutes to reconstruct the exposed surface of layer 14 to a short depth. A thin (30–200 Å) stabilizing layer 15 of GaAs may then be deposited by MBE at a relatively low growth temperature of 550° C. or less. The heat treatment appears to alleviate surface crystalline defects and the stabilizing layer enables subsequent growth of good quality crystalline on the buffer stabilizing layer. As an alternative to regrowth of the GaAs, other materials capable of preventing out-diffusion, but having appropriate lattice matching feature for growth of active layer thereon, may be used.

Next, a thin (200 Å) n+-GaAs layer 16 is formed at a substrate temperature of 580° C. by MBE on the LT GaAs layer 14 and Ni/Ge/Au contact metallization 18, about 0.4 microns thick, is sputter deposited or evaporated onto the n+ layer 16 to form an ohmic contact. Next, the ohmic contact layers 16 and 18 are etched to the surface of the LT GaAs layer 14 leaving a gap of about 5 microns between the two ohmic pads 18/16.

The top of the LT GaAs layer 14 forms a semi-insulating surface between the two ohmic pads. With no light incident on the gap 20, very little current flows from one conductive pad to the other. When light of sufficient intensity, such as from a laser, is incident on the semi-insulating material, charge carriers, or hole-electron pairs, are generated. The gap then becomes conductive, and current flows across the device. When the light source is removed, the current stops with a decay time characteristic of the recombination lifetime of the LT GaAs layer material.

An experimental device was made in accordance with the above description. The MBE layer used in this experiment was grown about 3 months prior to testing and the photoconductive detector was fabricated on this layer and packaged about one month prior to testing.

Figure 7:
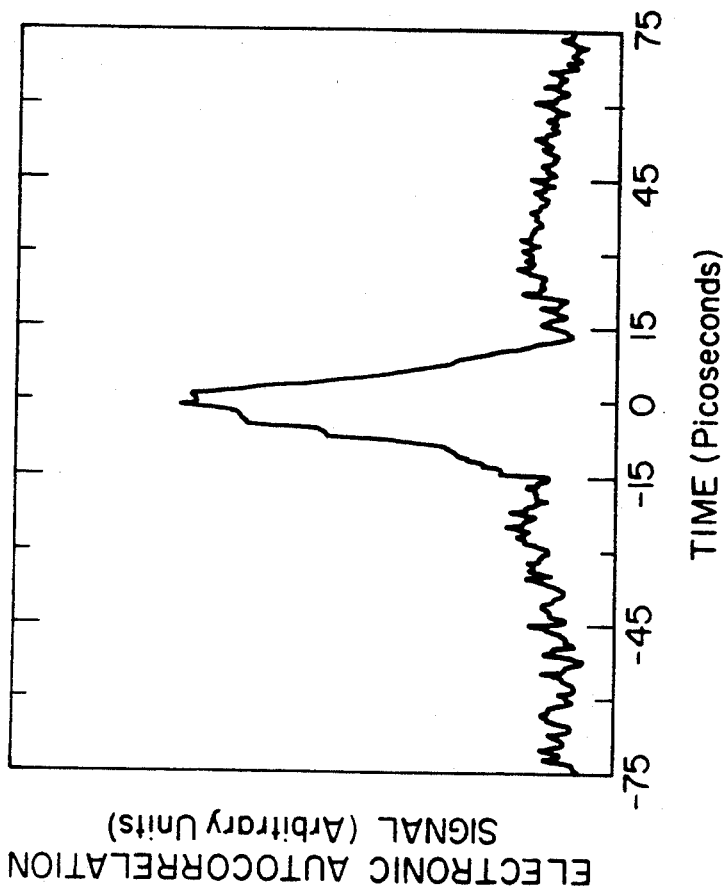
FIG. 7 is a plot of the electronic autocorrelation signal intensity versus time in picoseconds showing the response time at one-half of the full width at half maximum of an experimental photodetector of the invention made in accordance with FIG. 1.

The detector response was measured using a modified form of the correlation technique developed by Auston [D. H. Auston, *Picosecond Optoelectronic Devices*, edited by C. H. Lee (Academic, Orlando, 1984), pp. 73–117; T. F. Carruthers and J. F. Weller, *Technical Digest*, 1985 IEEE International Electron Devices Meeting, Washington, D.C. (IEEE, New York, 1985), p. 483]. The photoconductive switch was biased to about 10 V, and the dc dark current was less than the sensitivity of the available ammeter (<1 μA). Two synchronously-pumped mode-locked dye lasers operating at 800 and 785 nm and emitting about 5 ps pulses were used to perform the autocorrelation measurement. By using two independent dye lasers, optical coherent effects were eliminated. The pump and probe beams were chopped at 136 Hz and 27 KHz, respectively. The probe intensity was one order of magnitude lower than that of the pump beam. Both beams were focused to a spot size of about 5 microns on the photoconductive gap 20. The electronic autocorrelation result is depicted in FIG. 7. The LT GaAs photoconductive switch exhibits a system-limited time response of about 7.5 ps at one-half of the full width at half maximum (FWHM). This time scale is roughly the temporal resolution of the measuring system, which is limited by the 5 ps duration of the laser pulses.

Figure 3:
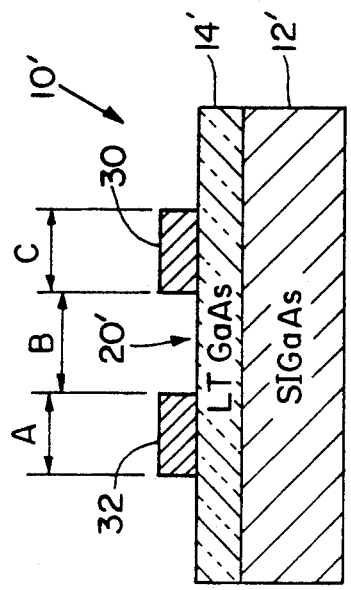
FIG. 3 is a schematic side view of a second embodiment of the optoelectric device of the invention.
Figure 4:
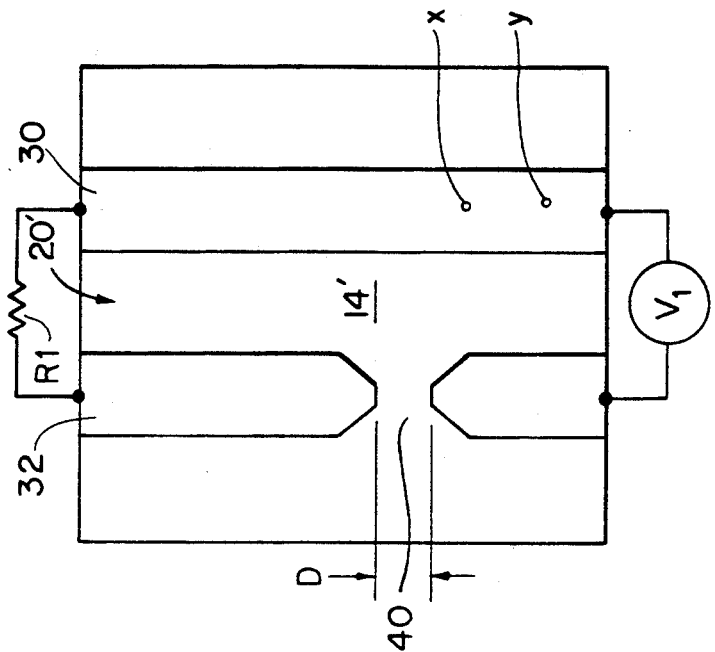
FIG. 4 is a top view of the embodiment of FIG. 3.

To measure the picosecond speed of the device, the technique of electro-optic sampling was used on another sample, shown in FIGS. 3 and 4. FIG. 3 is a schematic cross-section of the LT GaAs switch sample 10' and a schematic top view of the switch 10' is shown in FIG. 4. In the structure shown in FIGS. 3 and 4, items similar to those previously described in connection with FIGS. 1 and 2 carry a prime suffix. An LT GaAs layer 14' is formed by low-temperature MBE on a semi-insulating GaAs substrate 12'. A co-planar transmission line having a 91 ohm characteristic impedance, comprising a pair of indium conductors 30 and 32, arranged in adjacent parallel relationship, is then formed on the LT GaAs layer 14'. A tapered gap 40 is formed in one of the lines, i.e., line 32. The dimensions A, B and C were 50 microns each and the gap spacing D was 20 microns. A square wave voltage signal V1 of 10 volts at 3.7 MHz is applied across one end of the lines and a load R1 across the other end.

Figure 9:
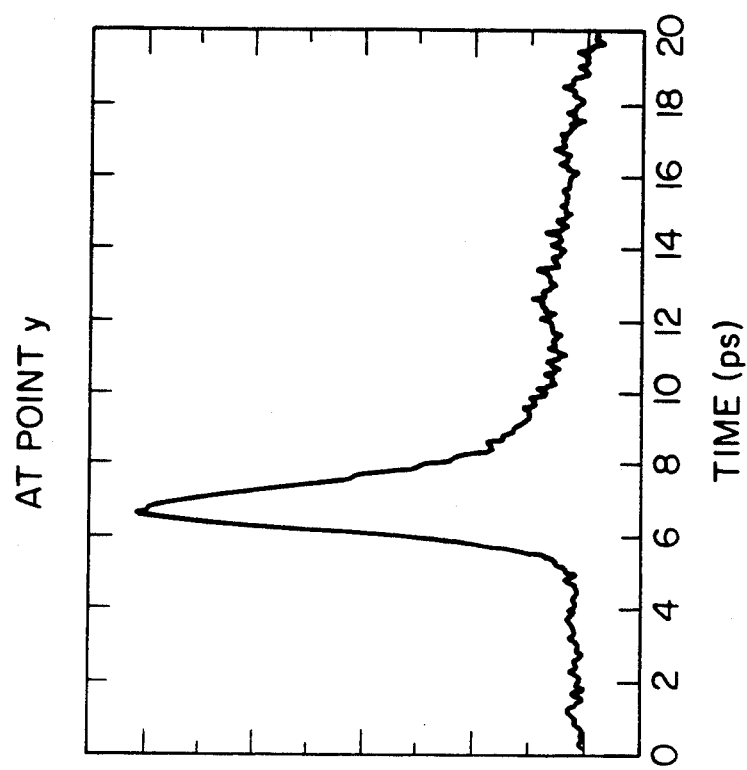
FIG. 9 is the same plot as in FIG. 8 but measured at point y.
Figure 8:
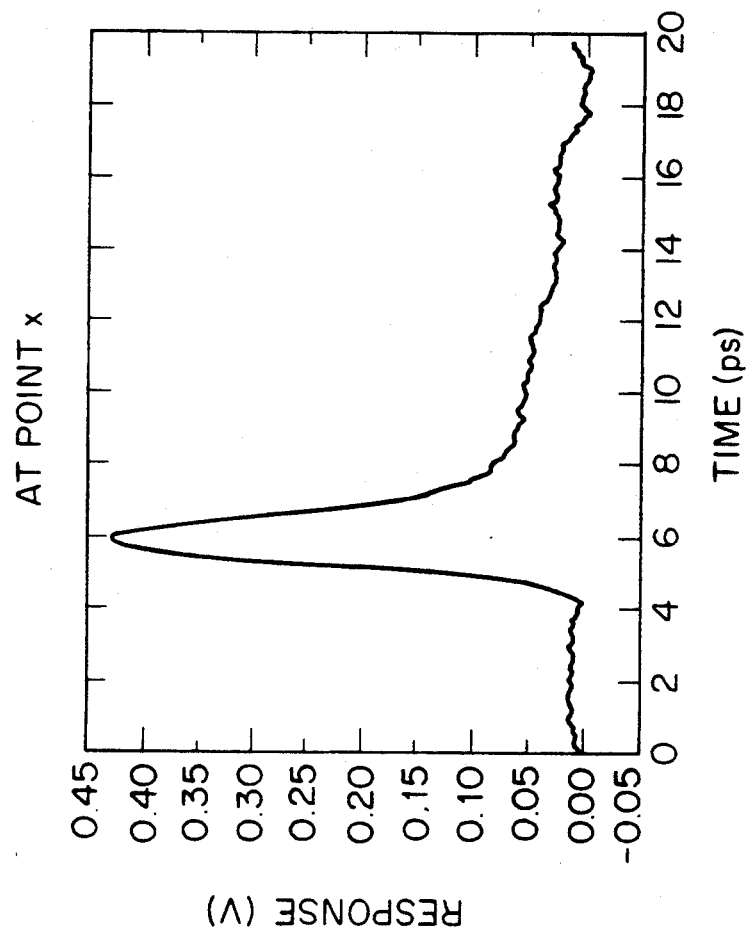
FIG. 8 is a plot of the impulse response generated by a 70 fs laser pulse measured at point x of FIG. 4.

A probe beam consisting of about 80 fs laser pulses at a 100 MHz repetition rate with a wavelength of 620 nm and an average power of about 9 mW (90 pJ/pulse) was focused onto the 20 μm gap 20'. The electrical pulse generated by this optical pulse was sampled at two points labeled as x and y on the transmission line 30 using a second 80 fs time-delayed optical pulse. Point x is immediately adjacent to the gap, whereas point y is a distance of 100 microns from the gap. The electrical signal measured at points x and y are shown in FIGS. 8 and 9, respectively. The FWHM of the pulse at both points is approximately 1.6 ps. This result translates into a 3 dB bandwidth of 220 GHz. The measured maximum voltage of the impulse is about 0.4 V, for a pulse energy of 90 pJ and a 10 V bias across the transmission line. The 1.6 ps result is comparable with the highest speeds ever reported for a photoconductive switch and the measured sensitivity is over an order magnitude greater than that measured for switches based on damaged materials or oxygen implanted SOS.

Figure 5:
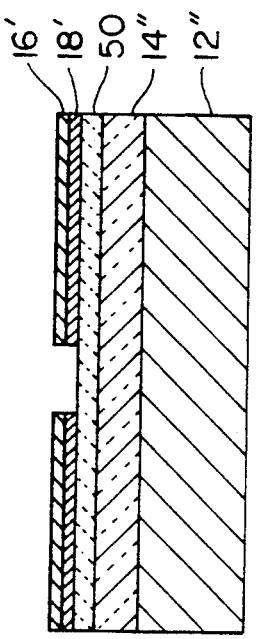
FIG. 5 is a side view of an alternate embodiment of FIG. 3.
Figure 6:
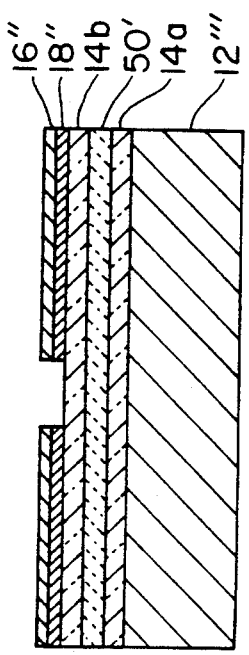
FIG. 6 is a side view of another alternate embodiment.

In the embodiment of FIG. 5, a thin conducting layer 50 is formed on the LT GaAs layer 14" prior to forming the contact metallization 18'/16'. This should improve the sensitivity of the device by providing better ohmic contacts to the device and providing additional charge carriers. In FIG. 6, an alternate embodiment is illustrated in which a conducting layer 50' is sandwiched between two LT GaAs layers 14a and 14b, respectively. This embodiment should again optimize sensitivity, since additional electron hole pairs can be generated in region 50' and still rapidly recombine in regions 14a and 14b.

In conclusion, a photoconductive detector has been developed using LT GaAs grown by molecular beam homoepitaxy at a temperature of 200° C. Autocorrelation measurements of the detector yielded a system limited response of about 7.5 ps. Electro-optic sampling was used to measure a temporal response of about 1.6 ps FWHM and an amplitude of about 0.4 V for a 10 V bias. These results compare favorably to the best results for any photoconductive switch yet reported. Further, the devices used in this demonstration were fabricated on material that was grown by MBE over one year ago, and, hence, the LT GaAs is clearly stable for extended periods of time. By optimizing this device, it may be possible to achieve even greater speeds and/or sensitivity. Since LT GaAs is compatible with GaAs device and IC technologies, this new photoconductive switch should find extensive use in high-speed device and circuit testing.

Equivalents

This completes the description of the preferred and alternate embodiments of the invention. Those skilled in the art may recognize other equivalents to the specific embodiments described herein, which equivalents are intended to be encompassed by the claims attached hereto. For example, other combinations of III–V materials are contemplated for use as low temperature semi-insulating (SI) photoconductive detector layers.

The table below lists various combinations of III–V materials in column 1 versus normal or typical MBE substrate growth temperatures in column 2, and approximate recommended substrate growth temperatures for the MBE SI layer 14 in column 3.

TABLE

| 1 | 2 | 3 |
|---|---|---|
| GaAs | 580° C. | 150–300° C. |
| GaP | 550° C. | 150–300° C. |
| InP | 450° C. | 50–200° C. |
| AlGaAs | 680° C. | 150–450° C. |

We claim:

1. A semiconductor photoconductive device comprising:
   a) a substrate formed of III–V species semi-insulating material;
   b) a crystalline layer on said substrate of homoepitaxial III–V species material having an excess of the more volatile of the species, said layer having a resistivity greater than or equal to $10^7$ ohm-cm;
   c) a conductive strip, separated by a gap on said layer and wherein, upon application of light to said gap, the layer becomes conductive and a signal applied to one side of the gap may be switched to the other side in less than 10 pico seconds.

2. The structure of claim 1 in which the III–V material is GaAs.

3. The structure of claim 1 in which the III–V material is taken from the group comprising InP, AlGaAs, GaP, GaAs.

4. A photoconductive device comprising:
   a) a homoepitaxial body of crystalline III–V molecular species material formed from Group III and Group IV molecular species, one of the species being more volatile than the other species;
   b) the body incorporating an excess of the more volatile of the species and having a resistivity in excess of $10^7$ ohm-cm; and
   c) a first electrical conductor on said body comprising an ohmic contact on the body with a gap separating one portion of the conductor from another portion of the conductor, and wherein upon application of light to said gap, a portion of the body underlying the gap becomes conductive such that a signal applied to one side of the gap is switched to the other side in less than 10 pico seconds.

5. The device of claim 4 wherein the body is formed of GaAs and the electrical conductor is comprised of n-type GaAs upon which a metallization film is formed.

6. The device of claim 4 further comprising a second electrical conductor, the second conductor formed in parallel and adjacent to the first conductor.

7. The device of claim 4 further comprising a thin conductive layer formed between a planar surface of the contact and a planar surface of the body.

8. A III–V photoconductive device comprising:
   a) a homoepitaxial crystalline layer of a compound of III material and V material formed on a substrate, one of the materials being more volatile than the other material;
   b) the homoepitaxial layer incorporating an excess of the more volatile of the materials in the homoepitaxial layer having a resistivity equal to or greater than $10^7$ ohm-cm;
   c) a stabilizing layer of III–V material formed over the homoepitaxial layer to minimize out diffusion of the more volatile of the materials; and
   d) ohmic contacts on the stabilizing layer, the contacts separated by a gap.

9. The device of claim 8 wherein the ohmic contacts are comprised of indium and form a coplanar transmission line.

10. A high-speed photoconductive detector having a response time of less than 10 picoseconds comprising:
    a) a crystalline homoepitaxial layer of III–V material formed on a substrate, one of the III–V materials being more volatile than the other;
    b) the layer having an excess of the more volatile of the materials and a resistivity in excess of about $10^7$ ohm-cm; and
    c) an electrical conductor on the layer having a gap separating one portion of the conductor from another portion of the conductor on said layer and wherein upon application of light to said gap, the layer becomes conductive and a signal applied to one side of the gap is switched to the other side in less than 10 pico seconds.

11. The detector of claim 10 wherein the layer is comprised of GaAs and a Group III element.

12. The detector of claim 10 further comprises a metallization film formed on the electrical conductor, the conductor comprises n-type GaAs.

13. The detector of claim 10 wherein the electrical conductor forms an ohmic contact to the semi-insulating layer.

* * * * *